(12) United States Patent
Harikai (10) Patent No.: US 9,076,859 B2
(45) Date of Patent: Jul. 7, 2015

(54) METHOD OF MANUFACTURING SEMICONDUCTOR CHIPS

(75) Inventor: Atsushi Harikai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/117,463

(22) PCT Filed: May 18, 2012

(86) PCT No.: PCT/JP2012/003277
§ 371 (c)(1),
(2), (4) Date: Nov. 13, 2013

(87) PCT Pub. No.: WO2012/157287
PCT Pub. Date: Nov. 22, 2012

(65) Prior Publication Data
US 2014/0295644 A1    Oct. 2, 2014

(30) Foreign Application Priority Data
May 19, 2011    (JP) .................................. 2011-112434

(51) Int. Cl.
*H01L 21/00*    (2006.01)
*H01L 21/78*    (2006.01)
(Continued)

(52) U.S. Cl.
CPC ............ *H01L 21/78* (2013.01); *H01L 21/0273* (2013.01); *H01L 21/304* (2013.01);
(Continued)

(58) Field of Classification Search
CPC ................. H01L 2924/10253; H01L 2924/00; H01L 21/78; H01L 2224/48091; H01L 21/3065; H01L 21/6836; H01L 21/304; H01L 21/6835; H01L 21/36836; H01L 2221/68327; H01L 2924/01079
USPC ...................... 257/E21.02, E21.11–13, E21.4, 257/107–185, 414–470, 499–564, 618–652, 257/787–796; 438/22–43, 51, 68, 106–127, 438/455–465, FOR. 386
See application file for complete search history.

(56) References Cited

U.S. PATENT DOCUMENTS

2002/0037631 A1    3/2002 Mimata
2004/0043614 A1    3/2004 Koizumi
(Continued)

FOREIGN PATENT DOCUMENTS

JP    3-185750    8/1991
JP    3-205846    9/1991
(Continued)

OTHER PUBLICATIONS

International Search Report (ISR) issued Jun. 26, 2012 in International (PCT) Application No. PCT/JP2012/003277.
(Continued)

*Primary Examiner* — Thao X Le
*Assistant Examiner* — Nduka Ojeh
(74) *Attorney, Agent, or Firm* — Wenderoth, Lind & Ponack, L.L.P.

(57) ABSTRACT

A method of manufacturing semiconductor chips includes removing an insulating film in a dividing region by plasma etching to a front surface. Then, roughness on a resist mask formed on the front surface is removed by plasma treatment before a BG tape is attached. After a semiconductor wafer is thinned by grinding of a backside surface thereof, the BG tape is peeled. The semiconductor wafer is divided into individual semiconductor chips by plasma etching from the front surface thereof.

5 Claims, 5 Drawing Sheets (51) Int. Cl.
*H01L 21/027* (2006.01)
*H01L 21/304* (2006.01)
*H01L 21/3065* (2006.01)
*H01L 21/311* (2006.01)
*H01L 21/683* (2006.01)
*H01J 37/32* (2006.01)

(52) U.S. Cl.
CPC ...... *H01L21/3065* (2013.01); *H01L 21/31116* (2013.01); *H01L 21/31138* (2013.01); *H01L 21/6836* (2013.01); *H01L 2221/68327* (2013.01); *H01L 2221/6834* (2013.01); *H01J 37/321* (2013.01); *H01L 2221/68386* (2013.01)

(56) References Cited

U.S. PATENT DOCUMENTS

| | | |
|---|---|---|
| 2004/0102025 A1 | 5/2004 | Arita |
| 2005/0173065 A1 | 8/2005 | Arita |
| 2005/0200004 A1 | 9/2005 | Koizumi |
| 2009/0289228 A1* | 11/2009 | Furumura .................. 252/500 |
| 2010/0081257 A1* | 4/2010 | Hendricks et al. ........... 438/462 |
| 2010/0173474 A1* | 7/2010 | Arita et al. .................. 438/462 |

FOREIGN PATENT DOCUMENTS

| | | |
|---|---|---|
| JP | 7-201784 | 8/1995 |
| JP | 8-64828 | 3/1996 |
| JP | 2002-100588 | 4/2002 |
| JP | 2003-282490 | 10/2003 |
| JP | 2004-95952 | 3/2004 |
| JP | 2004-172364 | 6/2004 |
| JP | 2006-114825 | 4/2006 |
| JP | 2006114825 A * | 4/2006 |
| JP | 2010-165963 | 7/2010 |

OTHER PUBLICATIONS

International Preliminary Report on Patentability issued Nov. 28, 2013 in International (PCT) Application No. PCT/JP2012/003277, together with English translation thereof.

* cited by examiner

METHOD OF MANUFACTURING SEMICONDUCTOR CHIPS

This is a National Phase application in the United States of International Patent Application No. PCT/JP2012/003277 with an International filing date of May 18, 2012, which claims priority of Japanese Patent Application No.: 2011-112434 filed on May 19, 2011, the contents of which are incorporated herein by reference.

BACKGROUND OF THE INVENTION

1. Technical Field

The present invention relates to a method of manufacturing semiconductor chips in which a semiconductor wafer is divided and diced into individual pieces.

2. Background Art

In a known method of manufacturing semiconductor chips by dividing and dicing a semiconductor wafer into individual pieces, the semiconductor wafer is mechanically divided by a blade of a dicer. For instance, mechanical dicing with use of DBG (Dicing Before Grinding) technique is disclosed in JP 2002-100588 A. In the DBG technique disclosed in JP 2002-100588 A, grooves are formed on an element formation surface (front surface) of a semiconductor wafer by a blade, followed by attachment of a protection tape on the front surface. Subsequently, a surface (backside surface) of the semiconductor wafer opposed to the front surface is ground until the grooves are exposed, so that the wafer is diced into individual semiconductor chips.

The DBG technique with use of the dicer, however, has following problems. Firstly, a constraint of thickness of the blade (at least on the order of 40 to 50 μm) imposes limitations on improvement in chip yield per semiconductor wafer. Further, because the semiconductor wafer attached on the thin protection tape is diced into the individual semiconductor chips, interference among adjoining semiconductor chips may cause chipping on corner parts (edges) thereof. Furthermore, handling ability therefor is deteriorated after the backside surface is ground, because handling is needed with the diced semiconductor chips attached on the thin protection tape.

In addition to the mechanical dicing with use of dicer, a method (plasma dicing) of manufacturing semiconductor chips is known in which a semiconductor wafer is divided and diced into individual pieces by plasma etching. A plasma dicing method disclosed in JP 2004-172364 A including formation of resist pattern on a backside surface of a semiconductor wafer after grinding for thinning is executed, followed by plasma etching of backside surface thereof so that the semiconductor wafer is divided and diced into individual pieces. Disclosed in JP 2004-95952 A is a method in which a semiconductor wafer is divided and diced into individual pieces by execution of both of a step of performing plasma etching after forming a resist pattern on front surface and a step of performing plasma etching after forming a resist pattern on backside surface, that is, by execution of plasma etching from both the surfaces.

Disclosed in JP H07-201784 A is a method including forming a resist pattern on a front surface so as to cover element formation regions and attaching a protection tape on a backside surface, thereafter dividing and dicing a semiconductor wafer into individual pieces from the front surface by a dicer, and reforming sections produced by the dicer by plasma processing from the front surface.

With respect to method of manufacturing semiconductor chips in which a semiconductor wafer is divided and diced into individual pieces, there are various demands including not only above-mentioned the chip yield per semiconductor wafer, reduction in chipping, and the handling ability but also as small number of times of attaching of protection tape and small number of processes of photolithography for forming a resist pattern. The above described known methods of manufacturing semiconductor chips with the DGB technique or plasma dicing of various types cannot satisfy all of such demands.

It is an object of the present invention to provide a method of manufacturing semiconductor chips superior in various properties including chip yield per semiconductor wafer, reduction in chipping, and handling ability.

SUMMARY OF THE INVENTION

The present invention provides a method of manufacturing semiconductor chips by dividing a semiconductor wafer into the semiconductor chips, the semiconductor wafer having first surface on which a plurality of semiconductor element sections defined by a dividing region are formed on an insulating film and a second surface opposed to the first surface, comprising a step of forming on the first surface a mask that covers the semiconductor element sections but that exposes the dividing region, a first plasma dicing step of removing the insulating film in the dividing region that is exposed from the mask by plasma irradiation to the first surface, a step of attaching a protection tape on the first surface after the first plasma dicing step, a step of thinning the semiconductor wafer by grinding the second surface after the protection tape is attached, a step of attaching a holding tape with a frame on the second surface after the grinding, a step of peeling and removing the protection tape from the first surface after the holding tape is attached, a second plasma dicing step of removing a portion of the semiconductor wafer in the dividing region that is exposed from the mask by plasma irradiation to the first surface after the protection tape is peeled so as to divide the semiconductor wafer into the plurality of semiconductor chips each including one of the semiconductor element sections, and a step of removing the mask after the second plasma dicing step.

In the method of manufacturing semiconductor chips of the invention, chip yield per semiconductor wafer can be improved because the semiconductor wafer is divided into the plurality of semiconductor chips by the first and second plasma dicing steps without undergoing mechanical dicing with use of a dicer. Further, the dicing into the individual semiconductor chips attached on the holding tape with the frame prevents chipping that might be caused by interference among adjoining semiconductor chips. Furthermore, the method is superior in the handling ability because when the protection tape is attached after grinding of the second surface, the insulating film corresponding to the dividing regions is removed without the wafer being diced into individual chips.

Further, in the method of manufacturing semiconductor chips of the invention, simplification of the steps is attained in that the step of attaching the protection tape and the step of peeling the protection tape are each performed only one time. The simplification of the steps is also attained in that the mask formed on the first surface is used in both of the first and second plasma dicing and in that the step of forming the mask and the step of removing the mask are each performed only one time. Further, the insulating film (e.g., $SiO_2$) formed on the first surface is removed by the plasma irradiation (first plasma dicing step) on the same first surface and thus can be removed with reliability and at high rate.

Preferably, the method of manufacturing semiconductor chips further comprises a step of removing an affected layer produced on surfaces of the mask due to the first plasma dicing step by plasma irradiation to the first surface before the protection tape is attached.

The surfaces of the mask formed on the first surface are roughened and the affected layer is produced thereon in the first plasma dicing step for removing the insulating film. Excessive increase in attaching strength of the protection tape on the mask can be prevented by the removal of the affected layers. As a result, damages to the mask, such as peeling of the mask from the first surface, can be prevented when the protection tape is peeled from the first surface after the holding tape is attached on the second surface.

Specifically, the method of manufacturing semiconductor chips further comprises a step of removing an affected layer produced on the second surface due to the grinding by plasma irradiation to the second surface before the holding tape is attached.

Further, it is preferable that, in the step of removing the mask, the mask is removed by plasma irradiation to the first surface.

Effects of Invention

According to the method of manufacturing semiconductor chips in accordance with the invention, various properties including the chip yield, reduction in the chipping, and the handling ability can be improved.

BRIEF DESCRIPTION OF DRAWINGS

The foregoing and the other features of the present invention will become apparent from the following description and drawings of an illustrative embodiment of the invention in which:

FIGS. 1(A) through 1(E) are schematic sectional views for explaining a method of manufacturing semiconductor chips according to an embodiment of the present invention;

FIGS. 2(A) through 2(E) are schematic sectional views for explaining the method of manufacturing semiconductor chips according to the embodiment of the invention;

DETAILED DESCRIPTION OF THE INVENTION

An embodiment of the invention will be described below in detail with reference to the accompanying drawings.

Figure 1:
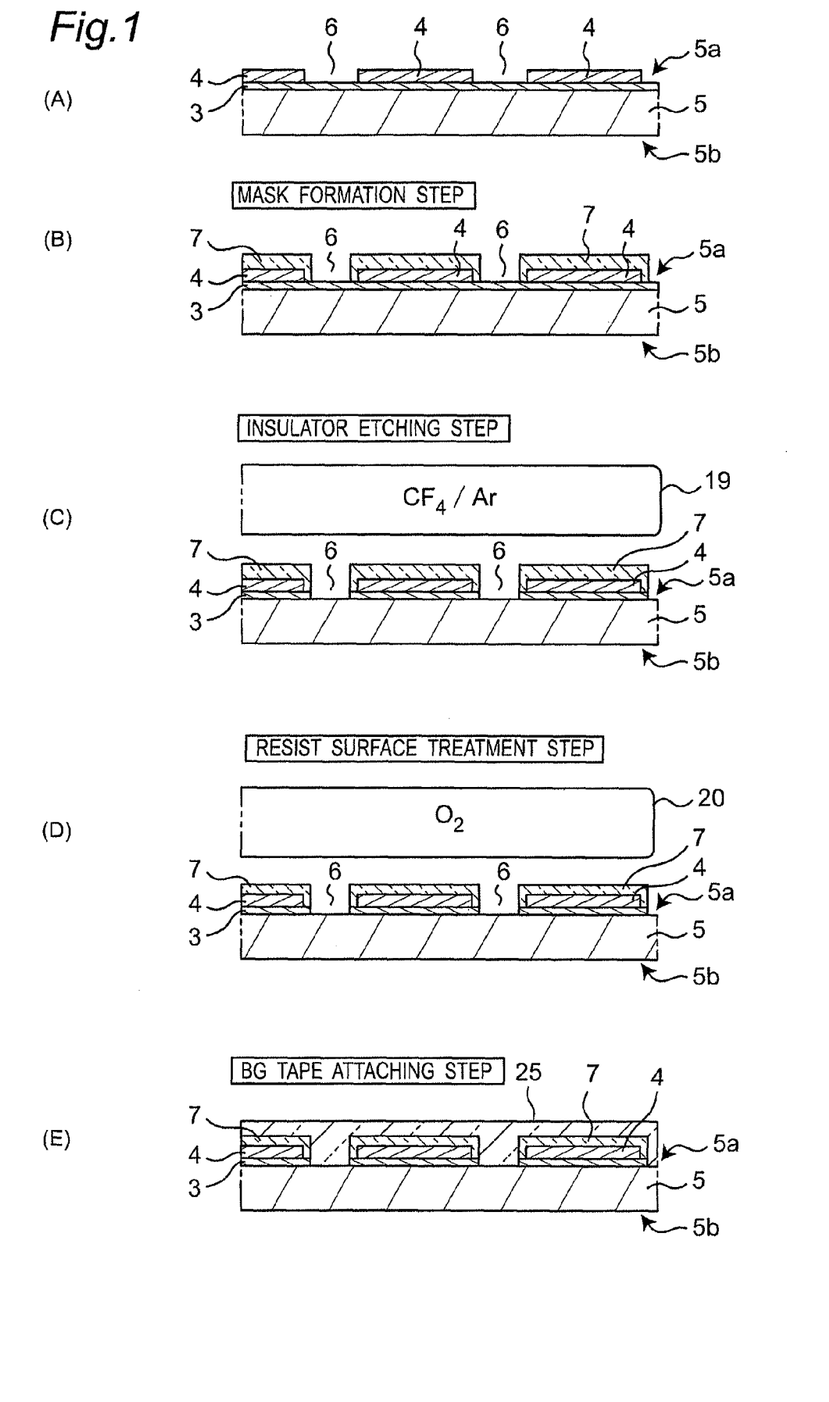
Figure 2:
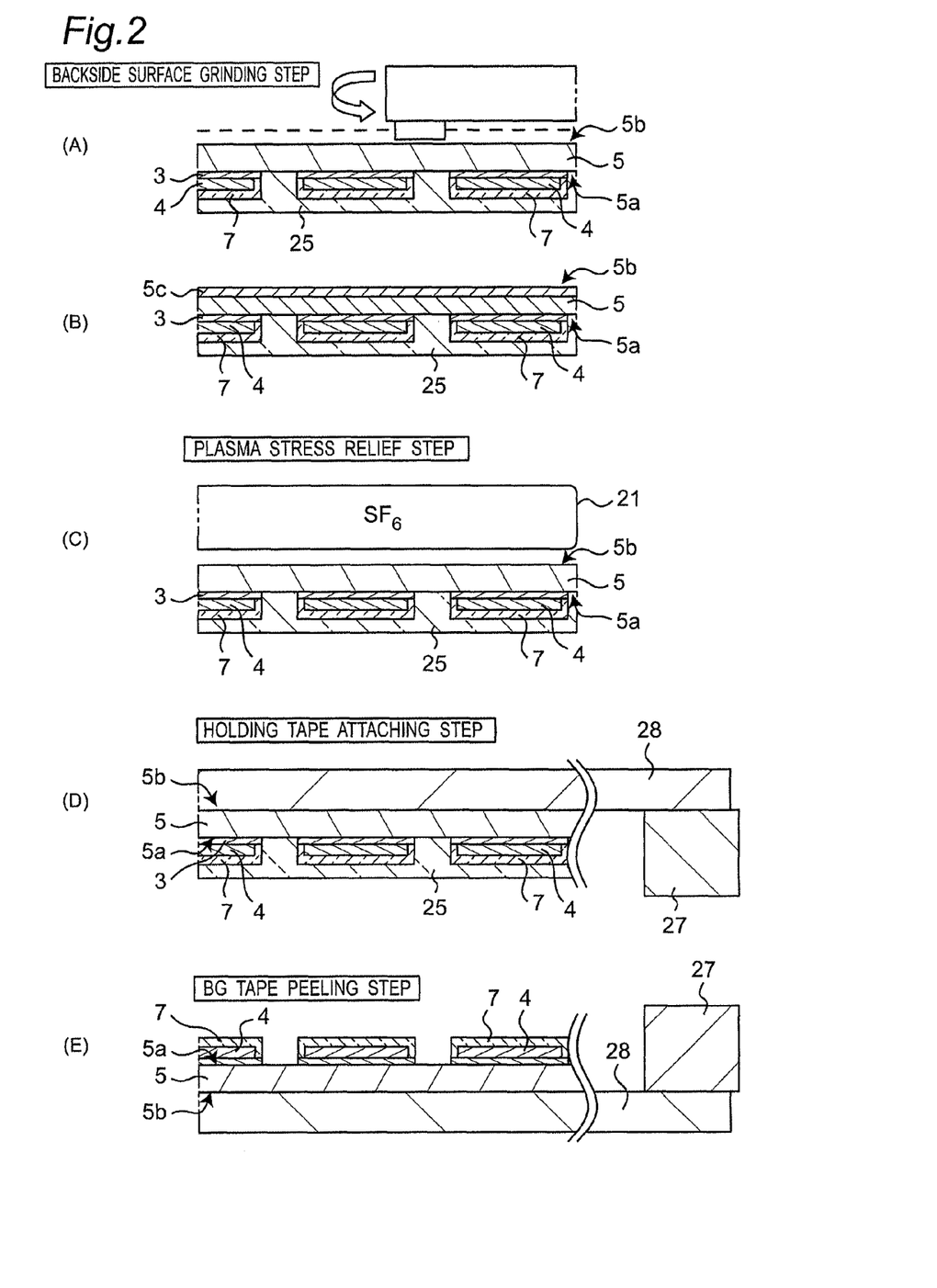
Figure 3:
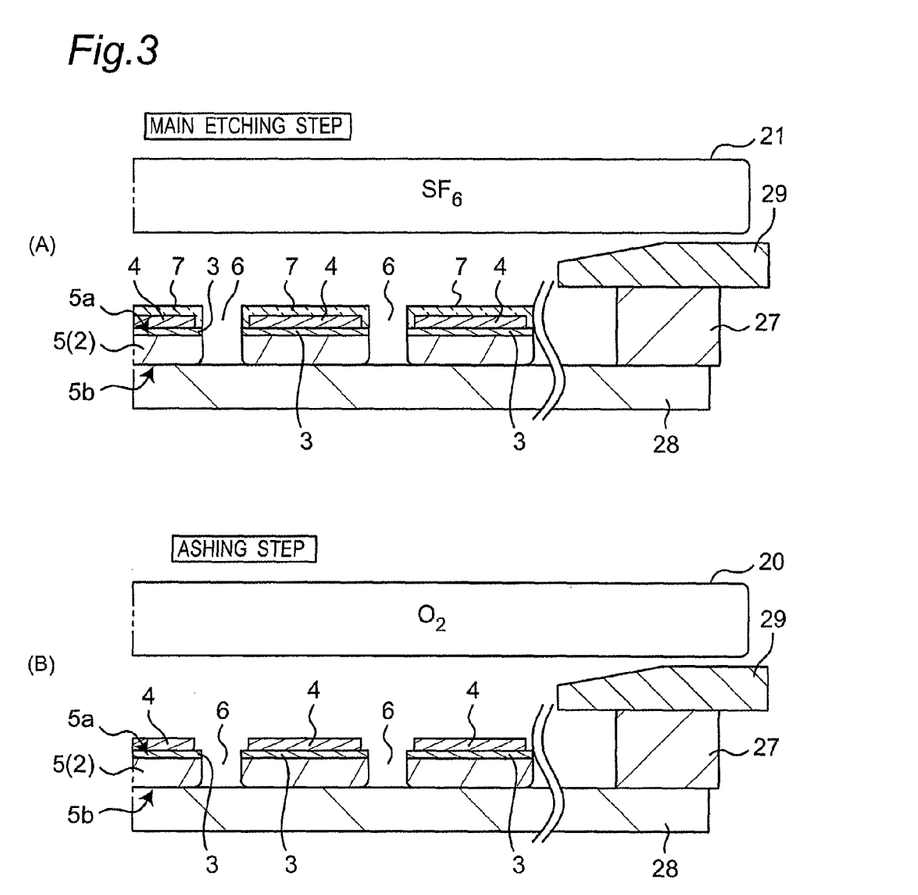
FIGS. 3(A) and 3(B) are schematic sectional views for explaining the method of manufacturing semiconductor chips according to the embodiment of the invention.
Figure 4:
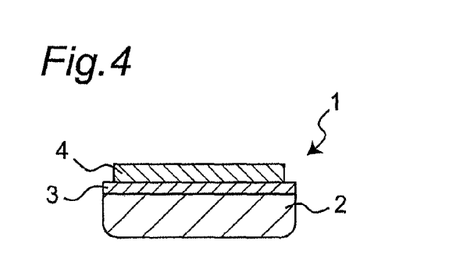
FIG. 4 is a schematic sectional view of a semiconductor chip manufactured by the manufacturing method according to the embodiment of the invention.

FIGS. 1 through 3 are schematic sections showing a method of manufacturing semiconductor chips in accordance with an embodiment of the invention. FIG. 4 shows a semiconductor chip 1 manufactured by the manufacturing method. The semiconductor chip 1 has a die 2, an insulating film 3 formed on the die 2, and an IC section (semiconductor element section) 4 formed on the insulating film 3. In the embodiment, the die 2 is made of Si or Si-based material and the insulating film 3 is made of $SiO_2$. Materials of the die 2 and the insulating film 3, however, are not limited thereto. For instance, the insulating film 3 may be made of SiN, SiOC, Low-k or the like.

As shown in FIG. 1(A), the insulating film 3 is formed on a front surface (first surface) 5a of the semiconductor wafer 5, and a plurality of IC sections 4 are formed thereon. There are gaps (dividing region 6) between each IC section 4 and other IC sections 4 adjoining and surrounding the IC section 4. In the dividing region 6, the IC sections 4 are not formed so that the insulating film 3 is exposed. In other words, the individual IC sections 4 are defined by the dividing region 6. By contrast, on a backside surface (second surface) 5b of the semiconductor wafer 5 opposed to the front surface 5a, no IC sections are formed.

First, a mask formation step shown in FIG. 1(B) is performed. Specifically, a resist mask 7 is formed on the front surface 5a of the semiconductor wafer 5 by photolithography. The resist mask 7 covers the individual IC sections 4 but exposes the insulating film 3 in the dividing region 6 without covering the film 3 therein.

Subsequently, an insulating film etching step (first plasma dicing) shown in FIG. 1(C) is performed.

Figure 5:
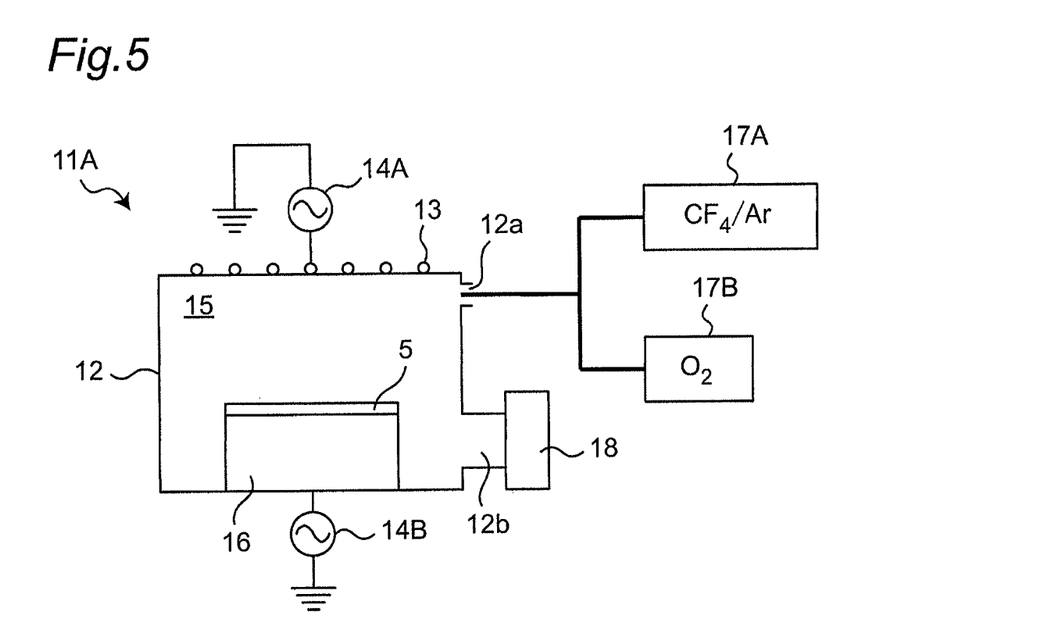
FIG. 5 is a schematic view of an example of a dry etching apparatus used in an insulating film etching step and a resist surface treatment step which will be described later.

FIG. 5 shows an example of a dry etching apparatus 11A that is used in the insulating film etching step and a resist surface treatment step which will be described later. Antenna 13 as upper electrode is provided above a top portion of a chamber (vacuum container) 12 of the dry etching apparatus 11A. The antenna 13 is electrically connected to a first radio frequency power supply 14A. On the other hand, a stage 16 on which the semiconductor wafer 5 is to be placed is provided on bottom part side in a process chamber 15 in the chamber 12. The stage 16 also functions as a lower electrode and is electrically connected to a second radio frequency power supply 14B. A gas introduction port 12a of the chamber 12 is connected to a $CF_4$/Ar mixed gas source 17A and an oxygen gas source 17B, and a gas discharge port 12b is connected to an evacuation unit 18 including a vacuum pump for evacuating the chamber 12.

In the insulating film etching step, initially, the semiconductor wafer 5 is placed on the stage 16, and mixed gas of $CF_4$ and Ar is supplied from the $CF_4$/Ar mixed gas source 17A into the process chamber 15 while the process chamber 15 is evacuated by the evacuation unit 18, so that pressure inside the process chamber 15 is maintained at a specified value. After that, radio frequency power is supplied from the first radio frequency power supply 14A to the antenna 13, so that plasma 19 is produced in the process chamber 15 and so that the semiconductor wafer 5 is irradiated with the plasma 19. In this process, a bias voltage is applied from the second radio frequency power supply 14B to the stage 16. Physicochemical action of radicals and ions in the plasma 19 removes the insulating film 3 in the dividing region 6 that is exposed from the resist mask 7 and exposes Si or Si-based material that is material of the semiconductor wafer 5.

Subsequently to the insulating film etching step, the resist surface treatment step shown in FIG. 1(D) is performed. In the resist surface treatment step, oxygen gas is supplied from the oxygen gas source 17B into the process chamber 15 while the process chamber 15 is evacuated by the evacuation unit 18, so that the pressure inside the process chamber 15 is maintained at a specified value. In this state, radio frequency power is supplied from the first radio frequency power supply 14A to the antenna 13, so that oxygen plasma 20 is produced in the process chamber 15 and so that the semiconductor wafer 5 is irradiated with the oxygen plasma 20.

The irradiation with the plasma 19 in the insulating film etching step (FIG. 1(C)) roughens surfaces of the resist mask 7 so as to produce an affected layer. Upon the irradiation with the oxygen plasma 20 in the resist surface treatment step (FIG. 1(D)), the affected layer (roughness) on the surfaces of the resist mask 7 is removed by physicochemical action of radicals and ions in the oxygen plasma 20.

Reasons for the removal of the affected layer on the surface of the resist mask 7 in the resist surface treatment step are as follows. As will be described later, a BG tape (protection tape) 25 is attached on the resist mask 7 in a step subsequent to the insulating film etching step (BG tape attaching step of FIG. 1(E)), and the BG tape is peeled from the resist mask 7 before a main etching step (FIG. 3(A)) for etching the semiconductor wafer 5 (BG tape peeling step of FIG. 2(E)). If the BG tape 25 is attached on the resist mask 7 with the affected layers residing on the surfaces of the resist mask 7, that is, with great roughness remaining on the surfaces of the resist mask 7, attaching strength of the BG tape 25 on the resist mask 7 will be excessively increased. If the BG tape 25 having such excessively high attaching strength is peeled in the BG tape peeling step (FIG. 2(E)), then damages such as peeling from the front surface 5a of the semiconductor wafer 5 may occur in the resist mask 7. In the embodiment, by contrast, excessive increase in the attaching strength of the BG tape 25 on the resist mask 7 is suppressed by the attaching of the BG tape 25 on the resist mask 7 after the removal of the affected layers on the surfaces of the resist mask 7 in the resist surface treatment step, that is, after decrease in the roughness of the resist mask 7. Accordingly, damages to the resist mask can be prevented when the BG tape 25 is peeled from the front surface 5a of the semiconductor wafer 5 in the BG tape peeling step (FIG. 2(E)).

After the resist surface treatment step, as shown in FIG. 1(E), the BG tape (protection tape) 25 for protection in backside surface grinding (Back Grind) is attached on the front surface side of the semiconductor wafer 5 (BG tape attaching step). That is, the BG tape 25 is attached on the surfaces of the resist mask 7 on the semiconductor wafer 5. The BG tape 25 is cut in accordance with outer shape of the semiconductor wafer 5 after being attached on the semiconductor wafer 5 or before being attached thereto, and thus the handling ability of the semiconductor wafer 5 is not impaired.

As shown in FIG. 2(A), subsequently, the backside surface 5b of the semiconductor wafer 5 is ground by a grinding device 26 (backside surface grinding step). By the backside surface grinding step, the semiconductor wafer 5 is thinned so as to have a specified thickness.

Figure 6:
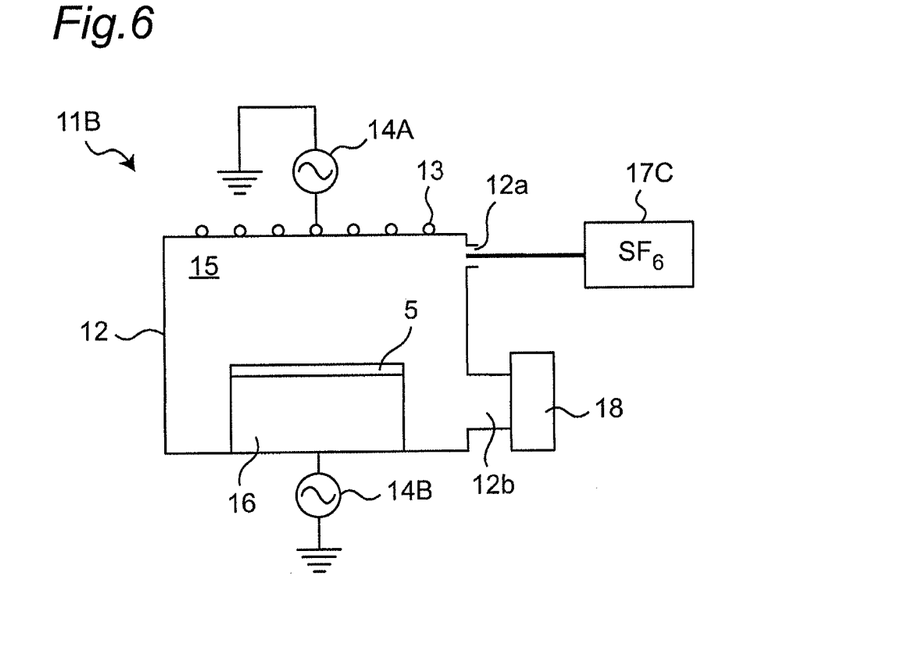
FIG. 6 is a schematic view of an example of a dry etching apparatus used in a plasma stress relief step.

On the backside surface 5b of the semiconductor wafer 5 ground by the backside surface grinding step, an affected layer 5c damaged by machining is produced (FIG. 2(B)). Then a plasma stress relief step for removing the affected layer 5c by plasma processing is performed (FIG. 2(C)). FIG. 6 shows an example of a dry etching apparatus 11B that is used in the plasma stress relief step. The dry etching apparatus 11B is the same as the dry etching apparatus 11A used in the insulating film etching step (FIG. 1(C)) and the resist surface treatment step (FIG. 1(D)) that have been described above, except that only an $SF_6$ gas source 17C is connected to the gas introduction port 12a of the chamber 12. Elements that are shown in FIG. 6 and that are the same as or similar to those in FIG. 5 are provided with the same reference characters.

In the plasma stress relief step, initially, a semiconductor wafer 5 is placed on the stage 16, and $SF_6$ gas is supplied from the $SF_6$ gas source 17C into the process chamber 15 while the process chamber 15 is evacuated by the evacuation unit 18, so that pressure inside the process chamber 15 is maintained at a specified value. After that, radio frequency power is supplied from the first radio frequency power supply 14A to the antenna 13, so that $SF_6$ plasma 21 is produced in the process chamber 15 and so that the semiconductor wafer 5 is irradiated with the $SF_6$ plasma 21. The affected layer 5c is removed from the backside surface 5b of the semiconductor wafer 5 by physicochemical action of radicals and ions in the $SF_6$ plasma 21.

After the plasma stress relief step, as shown in FIG. 2 (D), the backside surface 5b of the semiconductor wafer 5 is attached on a holding tape 28 with a dicing ring (frame) 27 (holding tape attaching step).

Subsequently to the holding tape attaching step, the BG tape 25 is peeled from the semiconductor wafer 5 and is removed as shown in FIG. 2(E) (BG tape peeling step). That is, the BG tape 25 is peeled and removed from the front surfaces of the resist mask 7 in the BG tape peeling step. As described above, the affected layer (roughness) produced on the surfaces of the resist mask 7 by the insulating film etching step (FIG. 1 (C)) has been removed by the irradiation with the oxygen plasma 20 in the resist surface treatment step (FIG. 1(D)). Excessive increase in the attaching strength of the BG tape 25 on the resist mask 7 is suppressed by the removal of the affected layers. As a result, damages such as peeling from the front surface 5a of the semiconductor wafer 5 can be prevented from occurring in the resist mask 7 when the BG tape 25 is peeled from the front surface 5a of the semiconductor wafer 5 in the BG tape peeling step (FIG. 2(E)).

After the BG tape peeling step, a main etching step (second plasma dicing step) shown in FIG. 3(A) is performed.

Figure 7:
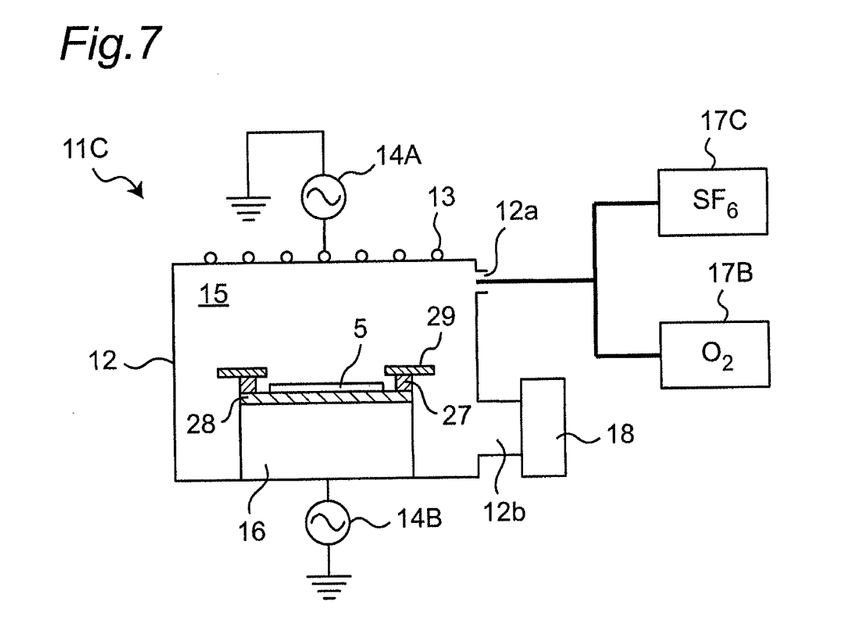
FIG. 7 is a schematic view of an example of a dry etching apparatus used in a main etching step and an ashing step.

FIG. 7 shows an example of a dry etching apparatus 11C that is used in the main etching step and an ashing step which will be described later. In the dry etching apparatus 11C, the $SF_6$ gas source 17C and the oxygen gas source 17B are connected to the gas introduction port 12a of the chamber 12. The dry etching apparatus 11C includes an annular cover 29 for protecting from the plasma a part of the holding tape 28 that protrudes from the semiconductor wafer 5 and the dicing ring 27. The cover 29 is driven to move up and down by a driving mechanism (not shown). The cover 29 is capable of moving between a lowered position (the cover is positioned in vicinity of upper sides of the holding tape 28 and the dicing ring 27 so as to provide protection from the plasma) shown in FIG. 7 and a raised position (not shown) where the cover is shifted upward away from the stage 16 so as to permit the holding tape 28 with the dicing ring 27 to be loaded on and unloaded from the stage 16. Other configurations in the dry etching apparatus 11C are similar to those in the dry etching apparatus 11A that is used in the insulating film etching step (FIG. 1 (C)) and the resist surface treatment step (FIG. 1 (D)) that have been described above. Elements that are shown in FIG. 7 and that are the same as or similar to those in FIG. 5 are provided with the same reference characters.

In the main etching step, initially, the holding tape 28 with the dicing ring 27 (the semiconductor wafer 5) is loaded on the stage 16 in a state in which the cover 29 is in the raised position. After the loading is completed, the cover 29 is moved to the lowered position. Subsequently, $SF_6$ gas is supplied from the $SF_6$ gas source 17C into the process chamber 15 while the process chamber 15 is evacuated by the evacuation unit 18, so that pressure inside the process chamber 15 is maintained at a specified value. After that, radio frequency power is supplied from the first radio frequency power supply 14A to the antenna 13, so that $SF_6$ plasma 21 is produced in the process chamber 15 and so that the semiconductor wafer 5 is irradiated with the $SF_6$ plasma 21. The semiconductor wafer 5 exposed in the dividing region 6 is removed by the physicochemical action of radicals and ions in the $SF_6$ plasma 21. The main etching step is continued until material forming a portion of the semiconductor wafer 5 in the divided region 6 that extends from the front surface 5a to the backside surface 5b is removed so that the semiconductor wafer 5 is divided into individual semiconductor chips 1. The part of the holding tape 28 that protrudes from the semiconductor wafer 5 and the dicing ring 27 are protected from the $SF_6$ plasma 21 by being covered with the cover 29.

Subsequently to the main etching step, the ashing step shown in FIG. 3(B) is performed. In the ashing step, oxygen gas is supplied from the oxygen gas source 17B into the process chamber 15 while the process chamber 15 is evacuated, so that the pressure inside the process chamber 15 is maintained at a specified value. In this state, radio frequency power is supplied from the first radio frequency power supply 14A to the antenna 13, so that oxygen plasma 20 is produced in the process chamber 15 and so that the semiconductor wafer 5 is irradiated with the oxygen plasma 20. The resist mask 7 is completely removed from the front surface 5a of the semiconductor wafer 5 by the irradiation with the oxygen plasma 20. The part of the holding tape 28 that protrudes from the semiconductor wafer 5 and the dicing ring 27 are protected from the oxygen plasma 20 by being covered with the cover 29.

The semiconductor chips 1 manufactured while being held on the holding tape 28 through the above steps are taken out of the dry etching apparatus 11C and are sent to the subsequent steps, and the divided semiconductor wafer 5 (aggregate of the semiconductor chips 1) is easy to handle in the subsequent steps because the wafer is held on the holding tape 28 with the dicing ring 27.

The semiconductor manufacturing method in accordance with the embodiment has characteristics that will be enumerated below in particular.

First, high chip yield is attained. The semiconductor wafer 5 is divided into the plurality of semiconductor chips 1 by the two plasma dicing steps, i.e., the insulating film etching step (FIG. 1(C)) and the main etching step (FIG. 3(A)). That is, mechanical dicing with use of a dicer is avoided. Therefore, the chip yield per semiconductor wafer 5 can be improved.

Occurrence of chipping can effectively be suppressed. The occurrence of the chipping can greatly be reduced because the semiconductor wafer 5 is diced into the semiconductor chips 1 by the insulating film etching step (FIG. 1(C)) and the main etching step (FIG. 3(A)) that are noncontact processing with use of the plasma. The chipping that might be caused by interference among adjoining semiconductor chips 1 can be prevented because the semiconductor wafer 5 is diced into the individual semiconductor chips 1 in the main etching step (FIG. 3(A)) while remaining attached on the holding tape 28 with the dicing ring 27.

Satisfactory handling ability of the semiconductor wafer 5 can be ensured through all the steps. To begin with, the semiconductor wafer 5 is handled without being divided from the mask formation step (FIG. 1(B)) to the BG tape peeling step (FIG. 2(E)). This ensures the satisfactory handling ability of the semiconductor wafer 5 including that for handling by automatic transfer mechanism or manual handling. Further, the satisfactory handling ability is ensured also after the division because the division of the semiconductor wafer (the main etching step of FIG. 3(A)) is performed on the holding tape 28 with the dicing ring 27 and because the handling after the division is performed through the holding tape 28 with the dicing ring 27.

The semiconductor manufacturing method in accordance with the embodiment also has characteristics as follows, in addition to the improvement in the chip yield, the reduction in the chipping, and the improvement in the handling ability that have been describe above.

Simplification of the steps can be attained. Initially, the simplification of the steps is attained in that the step for attaching the BG tape 25 (the BG tape attaching step of FIG. 1(E)) and the step for peeling the BG tape (BG tape peeling step of FIG. 2(E)) are each performed only one time. The simplification of the steps is attained in that the resist mask 7 formed on the front surface 5a is used in both of the insulating film etching step (FIG. 1(C)) and the main etching step (FIG. 3(A)) and in that the formation of the resist mask 7 (resist mask formation step of FIG. 1(B)) and the removal of the resist mask 7 (ashing step of FIG. 3(B)) are each performed only one time.

The mask formation step (FIG. 1(B)) for providing the resist mask 7 on the semiconductor wafer 5 is performed before the semiconductor wafer 5 is thinned, i.e., in a state in which the semiconductor wafer 5 has sufficient rigidity. The semiconductor wafer thinned by the backside surface grinding step has such low rigidity as to deform like paper and thus presents high difficulty in formation of the resist mask thereon. Provided that the mask formation step is performed before the semiconductor wafer 5 is thinned, as in the embodiment, by contrast, the formation of the resist mask 7 by the photolithography is facilitated and it is unnecessary to use a special device for forming the mask.

The BG tape peeling step (FIG. 2(E)) for peeling and removing the BG tape 25 from the semiconductor wafer 5 is performed before the semiconductor wafer 5 is divided and diced into individual pieces and thus work for the step is facilitated. It is not easy to peel the BG tape after the semiconductor wafer 5 is divided and diced into individual pieces. In particular, decrease in size of the semiconductor chips 1 might cause increase in difficulty of the work. On condition that the size of the semiconductor chips 1 is small, advantages of performing the BG tape peeling step before the dicing of the semiconductor wafer 5 as in the embodiment are particularly remarkable.

The insulating film 3 formed on the front surface 5a of the semiconductor wafer 5 is removed by the plasma irradiation to the same front surface 5a in the insulating film etching step (FIG. 1 (C)) and thus can be removed with reliability and at high rate. The insulating film etching step (FIG. 1(C)) is performed before the performance of the backside surface grinding step (FIG. 2(A)), that is, in a state in which the semiconductor wafer 5 is not yet thinned and is sufficiently thick to be easy to handle, and it is thus unnecessary to use a special device therefor.

The affected layer (roughness) on the surfaces of the resist mask 7 is removed in the resist surface treatment step (FIG. 1 (D)) as described above, and thus damages (such as peeling from the front surface 5a) to the resist mask 7 can be prevented when the BG tape 25 is peeled and removed from the front surface 5a of the semiconductor wafer 5.

Table 1 shows a comparison between the method of manufacturing semiconductor chips in accordance with the embodiment and other manufacturing methods by which the same semiconductor chips 1 can be manufactured from the semiconductor wafer 5 shown in FIG. 1 (A).

TABLE 1

| | DBG | BACKSIDE SURFACE PLASMA DICING | BOTH SURFACE PLASMA DICING | FRONT SURFACE PLASMA DICING | EMBODIMENT |
|---|---|---|---|---|---|
| CHIP YIELD | x | ○ | ○ | ○ | ○ |
| CHIPPING REDUCTION | x | ○ | ○ | ○ | ○ |
| HANDLING ABILITY | x | x | x | x | ○ |
| TAPE ATTACHING | x | x | x | x | ○ |
| MASK FORMATION STEP | — | x | x | x | ○ |
| ETCHABILITY FOR INSULATING FILM | — | x | ○ | ○ | ○ |

In Table 1, the manufacturing method in accordance with the embodiment is compared with four other manufacturing methods that will be enumerated below.

"DBG (Dicing Before Grinding)" is a manufacturing method in which the semiconductor wafer is mechanically divided by a blade of a dicer before grinding for thinning the semiconductor wafer 5.

"BACKSIDE SURFACE PLASMA DICING" is a manufacturing method in which the semiconductor wafer 5 is divided into the individual semiconductor chips 1 by plasma irradiation only to the backside surface 5b on which the IC sections 4 are not formed.

"BOTH SURFACE PLASMA DICING" is a manufacturing method in which the semiconductor wafer 5 is divided into the individual semiconductor chips 1 by sequential plasma irradiation to both of the front surface 5a on which the IC sections 4 are formed and the backside surface 5b on which the IC sections 4 are not formed.

"FRONT SURFACE PLASMA DICING" is a manufacturing method in which the semiconductor wafer 5 is divided into the individual semiconductor chips 1 by plasma irradiation only to the front surface 5a on which the IC sections 4 are formed.

In Table 1, the manufacturing methods are evaluated with regard to six items that will be enumerated below.

"CHIP YIELD" section shows evaluation in terms of the chip yield per semiconductor wafer 5. Symbols "○" are provided for the methods that achieve satisfactory chip yields, whereas symbols "X" are provided for the methods that achieve unsatisfactory chip yields.

"CHIPPING REDUCTION" section shows evaluation as to whether chipping on corner parts (edges) of the semiconductor chips 1 can effectively be prevented or reduced or not. Symbols "○" are provided for the methods that are capable of effectively reducing the chipping, whereas symbols "x" are provided for the methods that are not capable of effectively reducing the chipping.

In "HANDLING ABILITY" section, ease of handling of the semiconductor wafer 5 during the manufacture is evaluated as to whether the semiconductor wafer 5 that has fully been cut is easy to handle (convey) or not, in particular. Symbols "○" are provided for the methods in which the semiconductor wafer completely divided is handled only in a state in which the wafer is attached on the holding tape with the dicing ring, whereas symbols "x" are provided for the methods in which the semiconductor wafer 1 completely divided needs to be handled in a state in which the wafer is not attached on the holding tape with the dicing ring.

"TAPE ATTACHING" section shows evaluation as to whether a step of attaching on the semiconductor wafer 5 a tape such as a protection tape (BG tape 25 in the embodiment) and an adhesive tape that is used for holding the divided semiconductor wafer needs to be performed two or more times or not (in other words, whether a step of peeling the tape from the semiconductor wafer 5 needs to be performed two or more times or not). Symbols "○" are provided for the methods that require the attaching of the tape to be performed one time, whereas symbols "x" are provided for the methods that require the attaching of the tape to be performed two or more times. In addition, the symbols "x" marks are provided for the methods which include work of peeling the tape from the semiconductor wafer divided into semiconductor chips and the methods in which work of peeling the tape from the semiconductor wafer involves high difficulty.

"MASK FORMATION STEP" section shows evaluation as to whether it is necessary to perform the photolithography for forming the resist mask 7 on the semiconductor wafer thinned in a thinning step (backside surface grinding step of FIG. 2(A) in the embodiment) or whether it is necessary to perform the photolithography for forming the resist mask 7 two or more times (in other words, whether it is necessary to perform the removal of the resist mask 7 two or more times). Symbols "○" are provided for the methods that do not require the photolithography for forming the resist mask 7 after the thinning step and require the photolithography for forming the resist mask 7 to be performed one time, whereas symbols "x" are provided for the methods that require the photolithography step to be performed after the thinning step or require the photolithography to be performed two or more times.

"ETCHABILITY FOR INSULATING FILM" section shows evaluation as to whether the insulating film 3 ($SiO_2$ in the embodiment) that is more difficult to etch in general than the semiconductor wafer 5 (Si or Si-based material in the embodiment) can be etched with great efficiency or at high rate or not. Symbols "○" are provided for the methods by which the insulating film 3 can be etched at high rate (in other words, in which the insulating film is removed by etching from the front surface of the semiconductor wafer), symbols "x" are provided for the methods that are not such.

The evaluation of the manufacturing methods with regard to each evaluation item is as follows.

With regard to "CHIP YIELD," "DBG" constrained by thickness (at least on the order of 40 to 50 μm) of the blade is evaluated as "X," and all the other manufacturing methods are evaluated as "○" because all the methods are plasma dicing.

With regard to "CHIPPING REDUCTION," "DBG" involving mechanical grinding and polishing is evaluated as "X," and all the other manufacturing methods using noncontact processing by plasma are evaluated as "○."

With respect to "HANDLING ABILITY," "DBG," "BACKSIDE SURFACE PLASMA DICING," "BOTH SURFACE PLASMA DICING", AND "FRONT SURFACE PLASMA DICING" are all marked with "x," because all the methods require the handling of the completely divided semiconductor wafer that is not attached on the holding tape with the dicing ring. In the manufacturing method of the embodiment, the semiconductor wafer 5 except the insulating film 3 is not cut until the main etching step (FIG. 3(A)), that is, until the semiconductor wafer 5 is attached on the holding tape 28 with the dicing ring. Therefore, the manufacturing method of the embodiment is evaluated as "○" with regard to "HANDLING ABILITY."

With regard to "NUMBER OF TIMES OF PROTECTION TAPE ATTACHING," "DBG" is evaluated as "x" because the protection tape needs to be removed from the semiconductor wafer divided into the semiconductor chips though the protection tape is attached one time. "BACKSIDE SURFACE PLASMA DICING," "BOTH SURFACE PLASMA DICING," AND "FRONT SURFACE PLASMA DICING" are evaluated as "x" because the methods require the attaching and/or peeling of the tape to be performed two or more times. In the manufacturing method of the embodiment, the BG tape attaching step (FIG. 1(E)) and the BG tape peeling step (FIG. 2(E)) are each performed one time. The BG tape 25 is peeled from the semiconductor wafer 5 that is not yet divided into the semiconductor chips 1. Therefore, the manufacturing method of the embodiment is evaluated as "○" with regard to "NUMBER OF TIMES OF PROTECTION TAPE ATTACHING."

With regard to "MASK FORMATION STEP," photolithography is not performed at all in "DBG." "BACKSIDE SURFACE PLASMA DICING" and "FRONT SURFACE PLASMA DICING" are evaluated as "x" because the methods require the photolithography for mask formation to be performed one time but require the photolithography to be performed for the semiconductor wafer thinned in the thinning step. "BOTH SURFACE PLASMA DICING" is evaluated as "x" because the method requires the photolithography for mask formation to be performed two times in total for both the front surface and the backside surface. In the manufacturing method of the embodiment, the photolithography for forming the resist mask 7 is performed only one time (the mask formation step of FIG. 1(B)) for the semiconductor wafer 5 that is not yet thinned by the thinning step. Therefore, the manufacturing method of the embodiment is evaluated as "○" with regard to "MASK FORMATION STEP."

With regard to "ETCHABILITY FOR INSULATING FILM," etching is not performed at all in "DBG." "BOTH SURFACE PLASMA DICING" and "FRONT SURFACE PLASMA DICING" are evaluated as "○" because the insulating film 3 can be etched at high rate from the front surface 5a on which the insulating film has been formed. "BACKSIDE SURFACE PLASMA DICING" is inferior in etching efficiency and is evaluated as "x" because the insulating film 3 needs to be etched from the backside surface 5b opposed to the front surface 5a on which the insulating film has been formed. In the manufacturing method of the embodiment, the insulating film 3 can be etched at high rate because the insulating film 3 is etched from the front surface 5a on which the insulating film has been formed (the insulating film etching step of FIG. 1(C)). Therefore, the manufacturing method of the embodiment is evaluated as "○" with regard to "ETCHABILITY FOR INSULATING FILM."

As described above, it can be understood that only the manufacturing method of the embodiment is satisfactory with regard to all the six items and that the manufacturing method of the embodiment is superior to other manufacturing methods.

The invention can variously be modified as will be enumerated as examples below.

For the resist surface treatment step (FIG. 1 (D)), not only plasma treatment but also dry or wet process other than the plasma treatment can be employed as long as that is capable of removing the roughness produced on the surfaces of the resist mask 7 in the insulating film etching step (FIG. 1 (E)). The resist surface treatment step may be omitted providing that the resist mask 7 having the rough surfaces and the BG tape 25 can easily be peeled from each other because of low adhesion therebetween.

The insulating film etching step (FIG. 1 (C)) and the subsequent resist surface treatment step (FIG. 1 (D)) may be performed with use of different dry etching apparatuses. Likewise, the main etching step (FIG. 3(A)) and the subsequent ashing step (FIG. 3(B)) may be performed with use of different dry etching apparatuses. Conversely, any two or more of the insulating film etching step (FIG. 1 (C)), the resist surface treatment step (FIG. 1 (D)), the plasma stress relief step (FIG. 2(C)), the main etching step (FIG. 3(A)), and the ashing step (FIG. 3(B)) that are plasma processing is performed (FIG. 2(C)) may be performed with use of one dry etching apparatus.

Various modifications and alterations of the disclosure will become apparent to those skilled in the art without departing from the spirit and scope of the disclosure, which is defined by the accompanying claims.

The invention claimed is:

1. A method of manufacturing semiconductor chips by dividing a semiconductor wafer into the semiconductor chips, the semiconductor wafer having a first surface on which a plurality of semiconductor element sections defined by a dividing region are formed on an insulating film and a second surface opposed to the first surface, said method comprising:

forming on the first surface a mask that covers the semiconductor element sections but exposes the dividing region;

removing the insulating film in the exposed dividing region from the mask by applying plasma irradiation to the first surface;

removing an affected layer produced on surfaces of the mask due to the plasma irradiation for removing the insulating film by applying plasma irradiation to the first surface;

attaching a protection tape on the first surface after said removing of the affected layer;

thinning the semiconductor wafer by grinding the second surface after said attaching of the protection tape;

attaching a holding tape with a frame on the second surface after said grinding of the second surface;

peeling and removing the protection tape from the first surface after said attaching of the holding tape;

removing the semiconductor wafer in the dividing region exposed from the mask by applying plasma irradiation to the first surface after said peeling and removing of the protection tape so as to divide the semiconductor wafer into the semiconductor chips each including one of the semiconductor element sections; and removing the mask after the semiconductor wafer is divided into the semiconductor chips by said applying of the plasma irradiation to the first surface.

2. The method of manufacturing semiconductor chips according to claim 1, further comprising removing an affected layer produced on the second surface due to the grinding by applying plasma irradiation to the second surface before said attaching of the holding tape.

3. The method of manufacturing semiconductor chips according to claim 2, wherein said removing of the mask is performed by applying plasma irradiation to the first surface.

4. The method of manufacturing semiconductor chips according to claim 1, further comprising removing an affected layer produced on the second surface due to said grinding by applying plasma irradiation to the second surface before said attaching of the holding tape.

5. The method of manufacturing semiconductor chips according to claim 1, wherein said removing of the mask is performed by applying plasma irradiation to the first surface.

* * * * *